United States Patent [19]

Bloomer

[11] Patent Number: 4,540,893

[45] Date of Patent: Sep. 10, 1985

[54] CONTROLLED SWITCHING OF NON-REGENERATIVE POWER SEMICONDUCTORS

[75] Inventor: Milton D. Bloomer, Scotia, N.Y.

[73] Assignee: General Electric Company, Schenectady, N.Y.

[21] Appl. No.: 499,579

[22] Filed: May 31, 1983

[51] Int. Cl.³ .................. H03K 17/60; H03K 3/26
[52] U.S. Cl. .................. 307/248; 307/255; 307/270; 307/571; 307/296 R
[58] Field of Search .................. 307/296 R, 270, 248, 307/300, 571, 254, 255

[56] References Cited

U.S. PATENT DOCUMENTS

| 4,251,742 | 2/1981 | Beelitz | 307/270 |
| 4,318,011 | 3/1982 | Zeis | 307/300 |
| 4,410,810 | 10/1983 | Christen | 307/300 |

*Primary Examiner*—Stanley D. Miller
*Assistant Examiner*—B. P. Davis
*Attorney, Agent, or Firm*—Geoffrey H. Krauss; James C. Davis, Jr.; Marvin Snyder

[57] ABSTRACT

Methods and circuitry for the controlled switching of non-regenerative power semiconductors to provide for a less rapid rate-of-change of load current while the power semiconductor is in its active region, thereby reducing electromagnetic interference. Methods and circuitry for the controlled turn-on with fast turn-off, controlled turn-off with fast turn-on or controlled turn-on and controlled turn-off of voltage-controlled and current-controlled semiconductors, with either load voltage (dV/dt) or load current (dI/dt) feedback are described.

24 Claims, 8 Drawing Figures

CONTROLLED SWITCHING OF NON-REGENERATIVE POWER SEMICONDUCTORS

BACKGROUND OF THE INVENTION

The present invention relates to power-switching semiconductors and, more particularly, to a novel method and circuitry for the controlled switching of non-regenerative power semiconductor devices to substantially reduce EMI while providing acceptable "active region" dissipation in the devices.

It is well known to minimize the time that a non-regenerative power-switching semiconductor device spends in the "active region", to prevent excessive power dissipation in that device. Hitherto, the need for reducing excessive switching power dissipation has been met by switching the device from a fully-on condition to a fully-off condition in as rapid a manner as possible, consistent with the maximum dV/dt or dI/dt limits of the device. The relatively rapid voltage and/or current change in the device has generated considerable amounts of electromagnetic interference (EMI).

If all power-switching semiconductors of the same type had identical characteristics, it might be possible to turn the device on or off by utilizing a programmed drive source having a desired rate of change. In practice, however, the tolerance on the semiconductor control element, e.g. on the gate voltage threshold in a power field-effect transistor (FET) or an insulated-gate rectifier (IGR), is often greater than the variation of the signal required at that control element for a transition from a substantially turned-off condition to a substantially turned-on condition, or vice-versa. Thus, one commonly used control electrode driving method is to change the charge in a control electrode capacitance (such as the internal gate electrode capacitance in an FET or an IGR, often having an external fixed capacitance in parallel therewith to provide a total capacitance) from a current source. This method may result in a control electrode (gate) voltage characteristic which approximates desired characteristics only over a portion of the switching time interval, due to the drain-gate or anode-gate capacitance, commonly known as the "Miller-capacitance". As the device starts to turn on or off, the Miller capacitance couples the drain, or anode, voltage change into the gate circuit and slows the rate-of-change of the gate voltage. If the interelectrode capacitances of all the devices of the same type were exactly the same, this might be a useable approach. However, since all devices are not identical, destructive switching effects may occur. It has been further observed that when the control (gate) element is driven by a high impedance source, such as a current source, a number of load conditions are possible which will result in destructive on/off self-switching of the power-switching device.

Accordingly, it is desirable to provide a control element drive signal which will cause the device to turn on and/or turn off slowly enough to substantially eliminate EMI, while maintaining the device switching losses at an acceptable level and to do so without introducing self-destructive oscillations in the power device.

BRIEF SUMMARY OF THE INVENTION

In accordance with the invention, the control electrode of a non-regenerative power-switching semiconductor device receives a signal which rapidly changes until the control element "on" or "off" threshold is reached, then changes at a slower rate while the device is turned to a substantially-on or substantially-off condition, and then again changes rapidly to a maximum value of the turn-on or turn-off signal. Dependent on the controlled switching device being utilized, the control electrode drive signal may be a current or a voltage proportional to that current. The initial drive current is provided from a current source means having a first, substantially-constant current magnitude. The first magnitude of the source current establishes the relatively rapid change desired for (1) rapidly reaching the control element "active-region" threshold level, and (2) for driving the control electrode from the substantially-turned-on (or off) level to full activation (or inactivation) of the controlled switching device. A variable current is subtracted from the substantially-constant current, responsive to feedback of the load current and/or voltage, to control the desired load current or voltage change at the decreased rate.

In presently preferred embodiments, the basic drive current is either supplied to a capacitance and subsequent voltage follower for driving voltage-controlled devices such as a power FET, or is applied directly to the control electrode, e.g. base electrode, of a current-controlled device, e.g. a power transistor. The output current of the current source means is adjusted responsive to feedback of a load parameter to provide the basic drive current, with the current source means itself being enabled responsive to an externally-provided signal to provide slow turn-on or slow turn-off, with the remaining turn-off or turn-on condition, if not already controlled by the circuit, being of a rapid-transition nature, as required for the particular load to be controlled and the particular end use of the control circuit. Either current or voltage feedback control can be utilized in the control circuit.

Accordingly, it is an object of the present invention to provide novel methods and circuitry for controlled switching of non-regenerative power semiconductors.

This and other objects of the present invention will become apparent upon consideration of the following detailed description, when read in conjunction with the drawings.

DETAILED DESCRIPTION OF THE INVENTION

Figure 2:
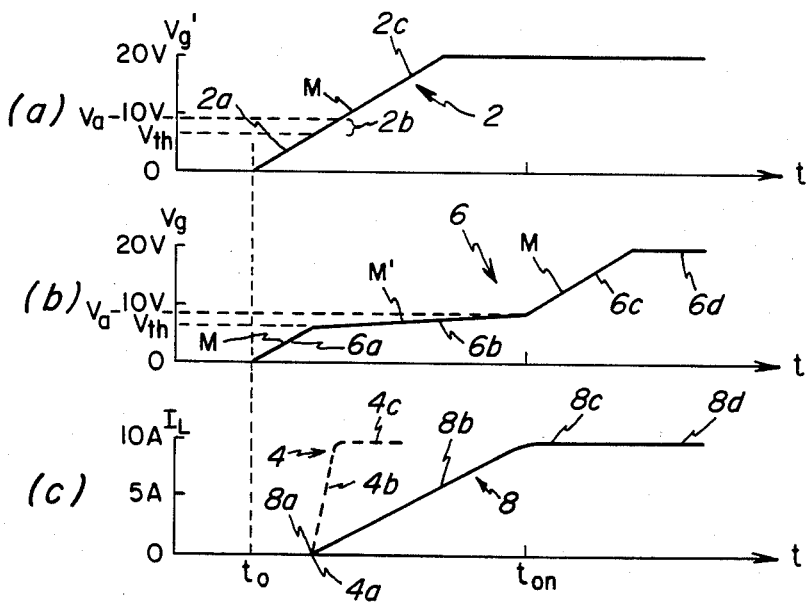
FIG. 2 is a set of coordinated graphs respectively illustrating: the voltage-control electrode voltage in prior-art control schemes; the voltage-control electrode voltage in accordance with the principles of the present invention; and the load current waveforms responsive to each of the foregoing control voltages.

Referring initially to FIG. 2, parts (a) and (c), a typical power FET may have the gate electrode thereof driven by a gate voltage $V_g'$ for device turn-on. The FET has a gate threshold voltage $V_{th}$, typically about 4 volts with respect to the source electrode, below which threshold voltage no substantial channel current flows. Thus, during the initial portion 2a of the $V_g'$ voltage waveform 2, there is little or no change in the load current $I_L$ waveform 4 (shown in broken line in part (c)). As the gate-source voltage waveform 2 continues to increase at a constant slope M, the threshold voltage $V_{th}$ is exceeded and substantial channel current flows, as shown in load current portion 4b. Typically, at a gate saturation $V_a$ voltage only a few volts above the threshold voltage, e.g. at about 6 volts, the device is nearly fully turned-on and almost the full load current $I_L$, e.g. of about 10 A., is flowing. The forward drain-source voltage drop can be further reduced at the rated current by increasing the gate voltage somewhat, as in portion 2c, typically by an additional 10 or more volts; the channel, and load, current is not appreciably increased, as shown at portion 4c. Thus, the sudden increase in channel/load current, in portion 4b, can generate considerable amounts of EMI. The current-step effect is as pronounced in the case of devices such as an insulated-gate rectifier (IGR), which device has a loss-producing forward drop which is also substantially reduced by even larger gate voltage increments, typically of at least 15-20 volts beyond turn-on threshold. Similar phenomena occur during device turn-off, and in current-controlled devices (such as power bipolar transistors and the like) if a control element current of constant rate-of-change M is used.

Figure 1:
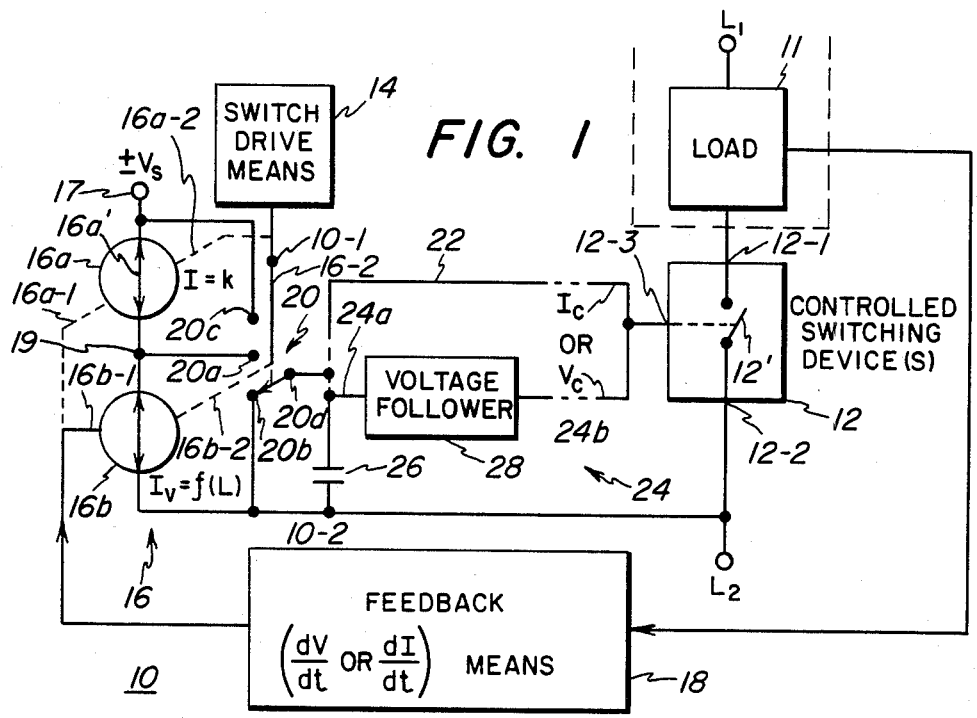
FIG. 1 is a schematic block diagram of a generic controlled switching circuit in accordance with the principles of my invention.

Referring now to FIGS. 1 and 2, parts (b) and (c), my invention provides a control electrode signal, such as a gate voltage for an FET or an IGR or base current for a bipolar power transistor, which is initially rapidly changed, at the rate M, as in portion 6a of the control gate $V_g$ curve 6, until the threshold $V_{th}$ value is reached. The control signal then increases at a desired slower rate M' in a portion 6b of the control curve, e.g. the gate voltage $V_g$ curve, less than the rate M in the initial portion 6a of that control curve, after the control electrode threshold, e.g. the gate voltage threshold $V_{th}$, is reached and until the control electrode saturation threshold, e.g. the gate saturation $V_a$ voltage, is reached. This allows the device output current, which is the load current $I_L$ for a series-connected load, to more gradually increase, as in portion 8b, once conduction starts (after substantially non-conductive portion 8a). At time $t_{on}$, when the saturation threshold $V_a$ value is reached and substantially all of the device/load current is flowing, the control electrode signal rate is again changed, to the original rapid rate M, as in portion 6c, to rapidly increase the control electrode signal to the level at which the device forward drop is minimized and to thereafter maintain that control electrode signal, as in portion 6d, thereat. The device/load current does not substantially change during the latter portions of the control signal curve, as shown by substantially constant current portions 8c and 8d, although device dissipation is reduced. A similar sequence of events, in the control signal decreasing direction, e.g. reducing the FET gate voltage $V_g$ from a high positive level (for an enhancement-mode FET) to a substantially zero level, can be utilized if the controlled turn-off of the controlled switching device is desired.

A generic form of the controlled switching circuit 10 is illustrated in FIG. 1. Circuit 10 functions to control the switching of current in load 11, in series connection with at least one controlled switching device means 12, between a pair of line terminals $L_1$ and $L_2$; either D.C. or A.C. potential may be connected to terminals $L_1$ and $L_2$, dependent upon the nature of load 11 and the configuration of the controlled switching means 12. The current-conduction property of the path between controlled switching means terminals 12-1 and 12-2 is controlled responsive to the signal at a control input 12-3. The signal at input 12-3, controlling the device 12 to turn-on, i.e. close the equivalent switch 12', or turn-off, i.e. open equivalent switch 12', may be a control current $I_c$, if device 12 is a current-driven device, such as a bipolar transistor and the like, or may be a control voltage $V_c$, if device 12 is a voltage-driven device, such as an FET, an IGR and the like. The control input 12-3 signal is provided responsive to a signal from a switch drive means 14, provided at input 10-1 to control the state of device means 12.

A current source means 16 provides first and second current sources 16a and 16b effectively connected in series between a potential source terminal 17 and a circuit common terminal 10-2. One of current sources 16a or 16b is a substantially-constant current source and the other current source 16 is a variable current source; the current-versus-time characteristic of each of sources 16a and 16b, as well as the polarity of the source potential $V_s$ (and therefore the direction of current flow from sources 16a and 16b, as indicated by arrows 16a' and 16b') is dependent upon whether circuit 10 is utilized for the controlled turn-on, controlled turn-off or controlled turn-on/turn-off of device means 12. For a controlled turn-on circuit for an enhancement device, a second control input 16-2, e.g. second control inputs 16a-2 and/or 16b-2, is enabled by the signal at input 10-1 to configure source 16a as a substantially-constant current source with current I=k (a constant) as facilitated by a positive $+V_s$ source voltage and current flowing toward common terminal 10-2; source 16b is a variable current source with the current thereof also flowing toward terminal 10-2, and of a magnitude determined by feedback, via feedback means 18, of a parameter of load 11 to a current source control input 16b-1. Thus, in the controlled turn-on configuration, current source 16b has a current which is a function of a load characteristic, e.g. the load voltage or current rate of change with respect to time, (dV/dt or dI/dt, respectively), or $I_v=f(L)$. It should be understood that the polarity of the voltage at terminal 17 and the direction of current flow may have to be reversed for a device of the same type but opposite conduction characteristic, e.g. a depletion-mode FET rather than an enhancement-mode FET. In a controlled turned-off configuration of circuit 10, second control input 16-2 is enabled to configure source 16b as a substantially-constant current source and source 16a as a variable-current source, having the current thereof controlled by the signal from feedback means 18 connected to a control input 16a-1. In a controlled turn-on/turn-off configuration, both control inputs 16a-1 and 16b-1 are utilized, with second control input 16-2 configuring sources 16a and 16b to be alternately constant-current or variable-current sources, dependent upon the direction in which the device equivalent switch 12' is to be actuated.

The differential current source output, at a node 19 therebetween, is connected to a first contactable terminal 20a of a switch means 20. Second contactable terminal 20b and third contactable terminal 20c of the switch means are respectively connected to common circuit terminal 10-2 or to the source $V_s$ terminal to provide for fast-switching operation, in one associated direction, of the output device 12, if required. A common terminal 20d of the switch means provides an output signal selectable, responsive to the signal at circuit input 10-1 from switch drive means 14, between terminals 20a and 20b or 20c. For a current-controlled switching device 12, the input control current $I_c$ is provided by a connection 22 between the switch means output terminal 20c and the controlled switching device input 12-3. For a voltage-controlled switching device 12, the control voltage $V_c$ at control input 12-3 is provided by a current-to-voltage converter means 24. Means 24 has a capacitor 26 having a voltage thereacross responsive to the current at switch means output 20c and uses a voltage follower means 28 to buffer the voltage across capacitor 26 and drive device input 12-3. It should be understood that only one of connection 22 or converter means 24 is generally utilized in a particular circuit 10.

The connection of switch means terminal 20b to circuit common terminal 10-2 provides for a relatively rapid turn-off switching action in device means 12 (if of the enhancement FET or bipolar transistor, types). The connection of switch means terminal 20c to the $V_S$ potential provides for a relatively rapid turn-on switching action in device means 12 (if of the enhancement FET or bipolar transistor, with base current-limiting resistor, types). The connection of the switch means common terminal 20d to the current source-selecting terminal 20a provides for a relatively slower, controlled switching action in device means 12. Thus, as illustrated, connection of the switch means common terminal 20d to the circuit-common selecting terminal 20b provides a substantially short circuit between the controlled switching device input 12-3 and device terminal 12-2. For gated switching devices requiring a positive "on" voltage at input 12-3, with respect to terminal 12-2, or for a current-controlled semiconductor requiring introduction of current $I_c$ into terminal 12-3, this connection renders device 12 in the turned-off condition, whereby load current does not flow through either device 12 or load 11. When switch drive means 14 causes the switch to have the common terminal 20d thereof connected to selectable terminal 20a current from the constant-current one of sources 16a and 16b flows through terminal 20d and causes a control current, or control voltage if capacitor 26 and voltage follower 28 are used, to appear at control input 12-3. The device input signal increases, although the current in the series-connected load and switching device controlled circuit (between terminals 12-1 and 12-2) does not appreciably flow until the aforementioned control input threshold is reached. When the threshold is reached and current begins to flow through the series-connected load 11 and switching device 12 conduction circuit, the load current or voltage change is fed back through means 18 and causes the remaining one of current sources 16b or 16a to subtract a current, proportional to the load characteristic magnitude fed back thereto, from the current available at switch terminal 20d. Therefore, the controlled switching device input 12-3 receives a signal having a lesser rate of change, whereby the load current is more slowly increased. When the load current has substantially reached the maximum value thereof, the time-rate-of-change of the load characteristic being measured by feedback means 18 is reduced and the variable-source current (which is being subtracted from the constant-source current) is substantially removed. Thereupon, the full constant source current is again available at switch output terminal 20d and the full rate of change of the signal at device control input 12-3 resumes, until a maximum level (determined by $V_s$) is reached.

If switch drive means 14 now provides a signal returning switching means 20 to the connection between common terminal 20d and contactable terminal 20b, charge is rapidly removed from the controlled switching device through the essentially short circuit between terminals 12-3 and 12-2 thereof, and the device rapidly turns off. It will be seen that if the conduction-type of the switching device is reversed, the aforementioned activity will result in a rapid turn-on/controlled turn-off characteristic, as will the reversal of constant and variable current sources for the same conduction-type semiconductor. Similarly, if switch means 20 is reconfigured to switch the feedback signal between current source control inputs 16a-1 and 16b-1, a controlled turn-on/controlled turn-off arrangement is provided.

Figure 1A:
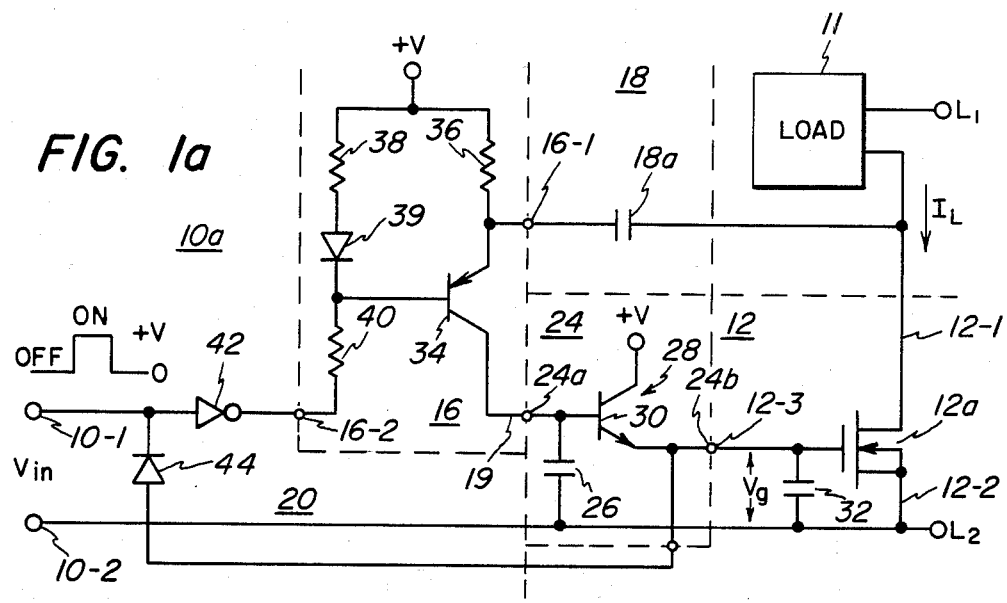
FIG. 1a is a schematic diagram of a circuit, in accordance with the principles of the present invention, for the controlled turn-on and fast turn-off switching of a voltage-controlled semiconductor device.

A first presently preferred circuit embodiment 10a, shown in FIG. 1a, provides for the controlled turn-on and fast turn-off of a voltage-controlled device, such as an enhancement-mode power FET 12a. Circuit 10a, due to the unidirectional control nature of device 12, is configured, as shown, for control of a D.C. load current, in a circuit energized by a D.C. voltage source having a more positive polarity at line terminal $L_1$, with respect to line terminal $L_2$. As the controlled switching device 12 is a voltage-controlled FET 12a, a control voltage $V_g$ must be provided at control input 12-3; accordingly, capacitor 26 and voltage follower 28, utilizing an NPN transistor 30, is provided. The collector electrode of transistor 30 is connected to a source of positive +V operating potential, with the base and emitter electrodes being respectively connected to the non-common terminal of conversion capacitor 26 and controlled switching device input 12-3. A capacitance 32 may be connected between input 12-3 and terminal 12-2 to increase the high-frequency stability of device 12.

The current source means 16 comprises a PNP transistor 34, having its emitter electrode connected through a source-current-setting resistance 36 to the source of positive operating potential +V. The collector electrode of transistor 34 is connected, via source output 19, to the input 24a of the voltage follower. A biasing network consisting of a fixed resistance 38 and a temperature-compensation diode 39, connected between positive operating potential +V and the base electrode of transistor 34, and a fixed resistance 40 having one terminal connected to the base electrode of transistor 34, is provided. The junction between the transitor 34 emitter electrode and the current-setting resistance 36 is feedback input 16-1. The remaining terminal of resistor 40 is connected to a current source means switching control input 16-2. Second input 16-2 receives the output signal of an inverter 42, in switching means 20. The inverter has its input connected to circuit drive input terminal 10-1. The cathode of a fast-turn-off diode 44 is also connected to terminal 10-1, while the anode thereof is connected to controlled switching device input 12-3.

In operation, if the load current is initially off, as facilitated by the application of a drive input voltage $V_{in}$ of substantially zero volts at terminal 10-1 with respect to common terminal 10-2, any charge on the gate electrode of the power switching FET device 12a is conducted to ground through forward-biased diode 44. The output of inverter 42 is at a relatively high voltage, typically about $+V$ volts, whereby current source transistor 34 and voltage-follower transistor 30 are both in the cut-off condition. A turn-on level, of $+V$ volts, is now applied as the input voltage $V_{in}$ at input terminal 10-1 with respect to common terminal 10-2. Fast-turn-off diode 44 is reverse-biased and appears as a large resistance. The output of inverter 42 falls substantially to the zero volt level, causing transistor 34 to turn on and supply current through input 24a to charge capacitor 26. The voltage at the base of transistor 30 increases, at a rate determined by the current from source 16 (itself determined by the magnitude of resistance 36 and the values of resistors 38 and 40) and the capacitance value of capacitor 26. As the voltage at the base electrode of transistor 30 increases, transistor 30 provides an output current charging capacitor 32 and the gate-source capacitance of the output device 12a. The gate voltage of the output device increases at the relatively rapid rate M until the threshold voltage $V_{th}$ is reached. Only when the threshold voltage is reached does a current $I_L$ begin to flow from terminal $L_1$, through load 11, through the conduction channel (between terminals 12-1 and 12-2) of the switching device 12a, to terminal $L_2$.

The action of the current source maintains a constant voltage drop across and, therefore, a constant current through resistor 36. This voltage drop is approximately equal to the voltage across resistor 38. The transistor 34 collector current available to charge capacitor 26 is then equal to the difference between the constant current flowing through resistor 36 and the current flowing in feedback means 18. The current in feedback capacitor 18 is equal to $C(dV_c/dt)$, where $V_c$ is the voltage across feedback capacitor 18. Since $V_c$ is equal to the difference between the output device/load voltage and the (constant) voltage at first input 16-1, there is a decrease in device 34 collector current of magnitude (CdV/dt). Accordingly, there is a decrease in the rate at which capacitance 26 charges and the rate at which the gate voltage $V_g$ of the control device changes is reduced to rate M'. The load current therefore increases at the lesser rate M', until the saturation value $V_a$ is reached and the output device is substantially fully-turned on, at which point the load voltage rate-of-change decreases. This decrease in the load voltage rate-of-change causes the dV/dt feedback through capacitance 18a to decrease, whereby the collector current of transistor 34 increases to its initial value. Responsive thereto, the current provided by source 16 to capacitance 26 increases at the initial rate, and the controlled switching device gate voltage $V_g$ now increases at faster rate M, driving the device to have the lowest drain-source voltage drop thereacross and reducing the power dissipated in the device.

When the circuit is turned-off, by providing a drive input $V_{in}$ signal of substantially zero volts, the output of inverter 42 provides a high ($+V$) signal, turning off the current source means 16, while diode 44 conducts and provides a low-resistance path for the rapid removal of charge from capacitor 32 and the gate-source capacitance of the output device, whereby the output device current conduction rapidly falls to zero and turns the load off. Capacitor 26 is discharged through the base-emitter junction of NPN transistor 30.

Figure 1B:
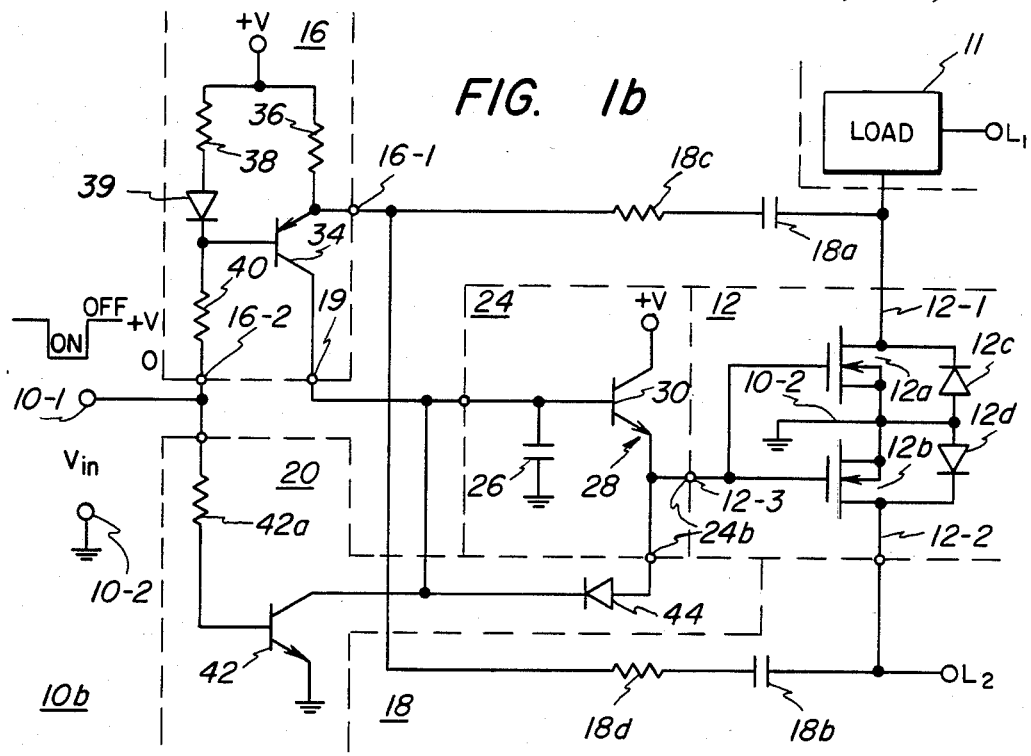
FIG. 1b is a schematic diagram of a circuit for the controlled turn-on and fast turn-off switching of at least one voltage-controlled semiconductor device.

Referring now to FIG. 1b, circuit 10b provides the same controlled turn-on/fast turn-off action for similar voltage-controlled switching devices, but with an A.C. source provided between line terminals $L_1$ and $L_2$. In order to accommodate the periodically-alternating polarities of the A.C. source, switching means 12 consists of a pair of enhancement-mode FETs 12a and 12b, having their source electrodes connected together to a common circuit ground 10-2. The drain-source conduction channel of each of the FETs is shunted by one of diodes 12c and 12d, poled in a direction opposite to that in which current is to be conducted through one of devices 12a and 12b in the appropriate half-cycle of the source waveform. In typical power MOSFETs, reverse conducting diodes 12c and 12d are parasitic in the devices 12a and 12b and need not be provided as discrete external devices. Thus, when terminal $L_1$ is positive with respect to terminal $L_2$, current can flow through the load 11 and the series-connected switching means, i.e. through device 12a (if turned-on) and thence through the forward-biased diode 12d, to terminal $L_2$; when terminal $L_1$ is negative with respect to terminal $L_2$, current flows from terminal $L_2$, through switching device 12b (if turned on), thence through forward-biased diode 12c and load 11 to terminal $L_1$. The gate electrodes of both switching devices 12a and 12b are connected in common to controlled switching means input terminal 12-3.

Because voltage-controlled switching devices are again utilized, the same voltage follower means 24 is utilized, with a similar current source means 16. Feedback means 18 must accommodate the dual polarities of the source signal, whereby first and second feedback differentiating capacitances 18a and 18b (for a dV/dt feedback scheme) are utilized. Series feedback resistances 18c and 18d are respectively in series with the associated one of feedback capacitances 18a and 18b, and have a common terminal connected to the control input 16-1 of the current source means. Resistances 18c and 18d, act in conjunction with current-setting resistance 36, to provide attenuation of the differentiated load voltage.

It will be seen that an inverted switch drive signal, turning the circuit 10b to the "on" condition for a substantially zero level and to the "off" condition for an operating potential $+V$ level, is utilized as the input $V_{in}$ voltage between terminals 10-1 and 10-2, as an illustration of one form of versatility of the generic circuit. As another example of versatility, the fast-turn-off diode 44 is controlled by an inverter transistor 42, with the inverter transistor collector potential being supplied by the output of current source 16. The inverter transistor 42 receives base electrode drive through a base resistor 44 connected to input terminal 10-1.

In operation, circuit 10b is assumed to have been receiving the "off" potential at the $+V$ level for a sufficient time such that transistor 42 has saturated to forward-bias diode 44 and provide a low-resistance path for draining all charge from the gate circuits of devices 12a and 12b, whereby current has ceased to flow through load 11. Current source 16 is also biased to the "off" condition and capacitor 26 has been discharged through the saturated switching transistor 42, diode 44 and the base-emitter junction of transistor 30. When the input voltage $V_{in}$ falls to the substantially zero level, switching transistor 42 enters the cut-off state, and diode 44 enters its high-resistance reverse-biased condition. Current source means 16 becomes active and provides a substantially constant charging current at output 19, to substantially linearly increase the voltage across capacitor 26 at a relatively rapid rate. The relatively rapid increase in capacitor voltage is followed by voltage follower transistor 30 and appears as the relatively rapid increasing voltage rate M at the gate electrodes of devices 12a and 12b. As previously discussed, substantial current does not flow in the drain-source channel of either device 12a or 12b until a gate threshold potential $V_{th}$ is reached. Thereupon, current begins to flow through load 11 and the load voltage increases. Dependent upon the half-cycle polarity of the A.C. source, the increasing load voltage is differentiated by the associated one of feedback capacitors 18a or 18b and establishes a current through the associated one of resistors 18c or 18d, which is subtracted from the constant current flowing through resistance 36. Therefore, a lesser current is provided at the collector electrode of transistor 34 and the capacitor 26 voltage changes at a slower rate M', which slower rate-of-change in gate voltage is applied to the switching devices. The devices increase the load current at this slower rate, until the devices are substantially saturated and the load current is at substantially its "full on" magnitude. Thereupon, the rate of change of the load voltage decreases and decreases the amount of current diverted at current source input 16-1. This causes the current flow from current source output 19 to rise to its original level. Thus, the current charging capacitor 26 increases and the gate voltage again rises at the original, relatively-rapid rate M, to fully saturate the devices and lower the voltage drop between controlled switching means terminals 12-1 and 12-2. When the circuit is turned off, by raising the input $V_{in}$ voltage to the +V "off" level, current source means 16 is turned off, switching transistor 42 is saturated and any stored gate charge flows through the forward-biased diode 44, rapidly turning off switching devices 12a and 12b.

Figure 1C:
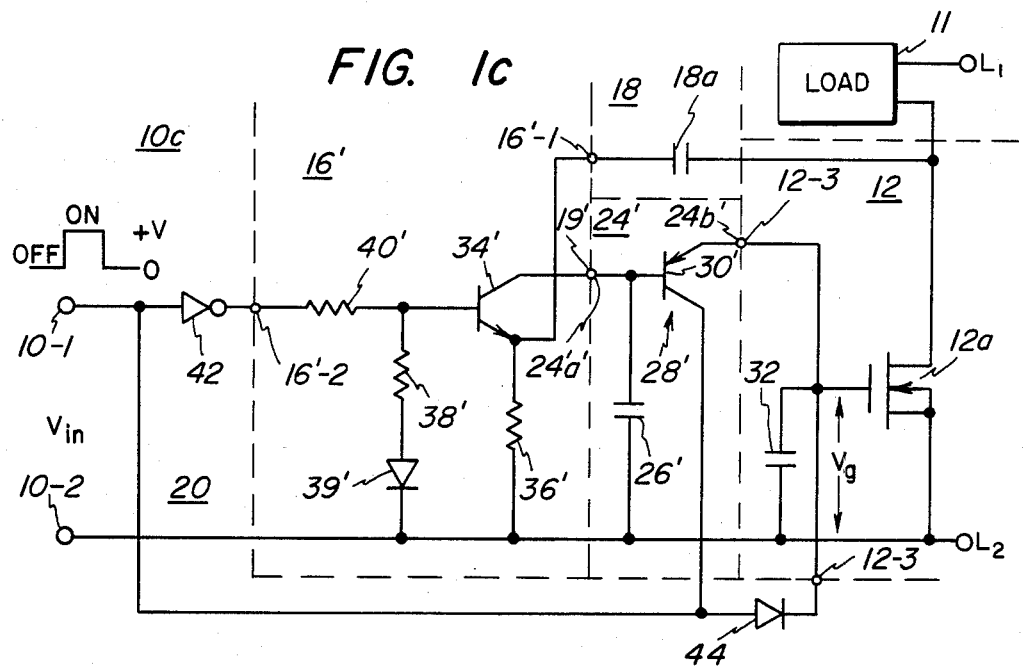
FIG. 1c is a schematic diagram of a circuit for the fast turn-on and controlled turn-off of a voltage-controlled semiconductor device.

Referring now to FIG. 1c, a voltage-feedback circuit 10c for providing fast turn-on/controlled turn-off of a voltage-controlled switching device (in a unipolar circuit) is illustrated. As in circuit 10a of FIG. 1a, a stability capacitance 32 is utilized in the controlled switching means 12, while a feedback capacitance 18a is utilized to provide the voltage feedback to current source means 16'. Switching means 20 includes inverter 42 and diode 44, having its polarity reversed, as the circuit will now provide for fast turn-on, in contradistinction to the diode direction for fast turn-off as provided in circuit 10a.

As the direction of controlled action is reversed, the polarity of the current source means transistor 34' is reversed, i.e. an NPN transistor is utilized. Similarly, the potentials at the electrodes are reversed, such that the transistor 34' emitter electrode is connected through current-setting resistance 36' to circuit common 10-2. In the current-source means biasing network, a series resistance 38' and a temperature-compensating diode 39' are series connected between the base electrode of transistor 34' and the farthest end of resistance 36', i.e. circuit common 10-2. A second resistor 40' in the current source means biasing circuit is connected between the base electrode of transistor 34' and the current source means switching control terminal 16'-2. The current source means feedback input 16'-1 is still connected to the emitter eledtode of transistor 34', while the current source output 19' is still taken from the collector electrode of the transistor 34'.

As a voltage-controlled output device 12a is still being utilized, the voltage follower means 24' is required. The charging capacitance 26' is connected between circuit common 10-2 and the voltage follower means input 24'a, to which the base electrode of the follower transistor 30' is also connected. However, because the direction of activity is reversed, follower transistor 30' is now a PNP transistor, still having its emitter electrode connected to the follower output 24'b and the controlled switching device input 12-3. The follower transistor collector electrode must be returned to a source of potential which is lower than the gate $V_g$ voltage, although such connection is only necessary when the output device is to be turned off. Since the switching control means 20 is configured to turn off the load current for a substantially zero volt $V_{in}$ input, the collector of transistor 30' is connected to drive input terminal 10-1.

In operation, it is assumed that the circuit has been turned off for some relatively long time, whereby the substantially zero volt drive input $V_{in}$ voltage, between input terminal 10-1 and common terminal 10-2, has appeared as a relatively high +V potential at the current source input 16'-2, turning on transistors 34' and 30' and reducing the output device gate voltage $V_g$ to substantially the zero volt level. Similarly, the turn-on diode 44 was reverse-biased, due to the "off" input voltage level and is in the high-resistance condition. Load current is turned on by applying a high +V level at input terminal 10-1, forward-biasing turn-on diode 44 and rapidly charging the switching device input capacitance to a gate voltage $V_g$ driving device 12a into saturation. Simultaneously therewith, the inverter 42 output voltage, at current source input 16'-2, falls to a low level and turns off current source transistor 34'. The voltage across capacitor 26' is caused to rise essentially to the level at the output device 12a gate electrode, due to the flow of current through the now-forward-biased base-emitter junction of transistor 30'.

Thereafter, the circuit is turned off by driving circuit terminal 10-1 with an input $V_{in}$ voltage reverting to the substantially zero level. Turn-on diode 44 is immediately reverse-biased and appears as a high resistance. The inverter output voltage, at current source input 16'-2, abruptly increases to substantially the +V level and turns on current source transistor 34'. The collector current out of terminal 19' is initially established by the bias network of resistors 38' and 40' and compensation diode 39', and by the magnitude of current-setting resistance 36'. The voltage across capacitance 26' begins to decrease, causing the voltage at follower output 24b' to decrease, whereby the switching device gate voltage $V_g$ begins to decrease at the rapid rate M. The switching device drain-source voltage begins to increase, as the device begins to go from saturation toward the active region; however, the load current does not appreciably decrease until the saturation threshold voltage (of magnitude $V_a$ greater than the conduction threshold voltage $V_{th}$) is reached. When the saturation threshold is reached and the device goes from saturation into the active region, the load current begins to decrease. The increase in switching device drain-source voltage, is fed back through feedback capacitance 18a and causes a current to be drawn from current source control terminal 16'-1. This current withdrawal temporarily decreases the current available from the collector electrode of transistor 34'. Therefore, the rate-of-change of voltage across capacitor 26' is decreased, and the output switching device gate voltage $V_g$ decreases at the lesser rate M'. As the switching device 12a passes through the threshold voltage $V_{th}$, the rate-of-change of load voltage decreases, whereby a smaller bypass current flows through feedback capacitance 18a and the current available from the collector electrode of transistor 34' increases to its original value. Responsive thereto, the rate-of-change of the voltage across capacitance 26' reverts to substantially the original value, whereby the decrease of gate voltage $V_g$ again decreases at the higher rate M, until the gate voltage is of a substantially zero magnitude, placing the output switching device 12a firmly in the cut-off region.

Figure 1D:
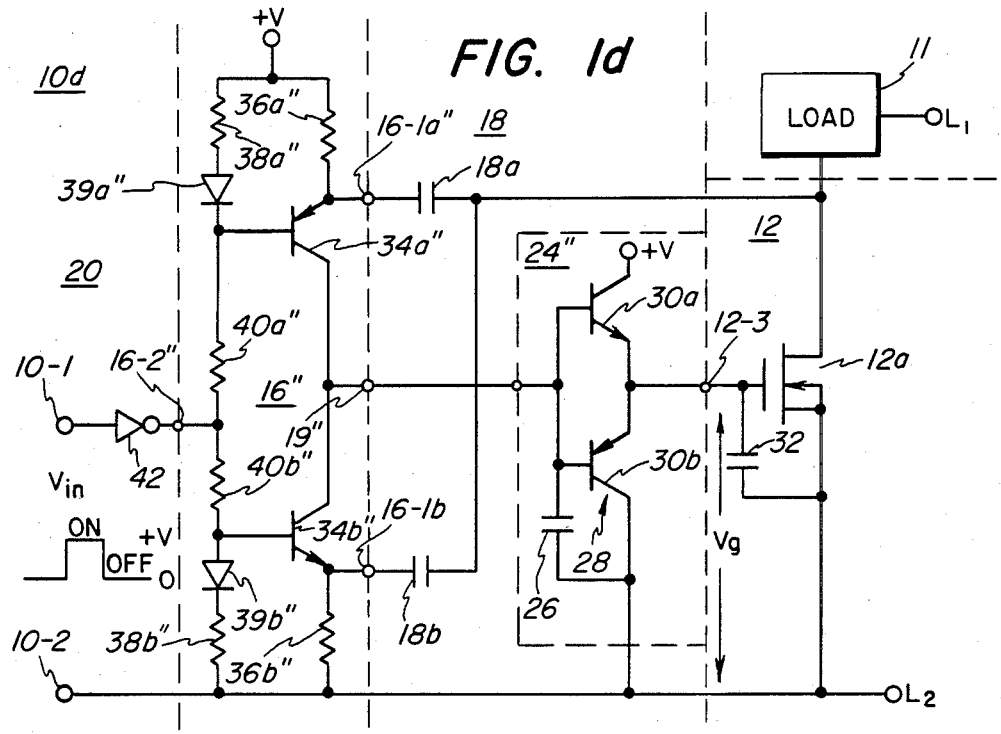
FIG. 1d is a schematic diagram of a circuit for the controlled turn-on and controlled turn-off switching of a voltage-controlled semiconductor device.

Referring now to FIG. 1d, a voltage-feedback circuit 10d for providing both controlled turn-on and controlled turn-off of a voltage-controlled switching device (in a unipolar circuit) is illustrated. Because both turn-on and turn-off are to be controlled, a fast-switching diode is not utilized in switching section 20; only inverter 42 is utilized to provide turn-on at a positive voltage greater than the voltage required for turn-off. It should be understood that, as shown in FIG. 1b, an inverter between the circuit input 10-1 and the current source 16" control input 16-2" is not required if the opposite control sense (e.g. a higher positive voltage for the "off" condition, with respect to the "on" condition) is to be used.

Because both turn-on and turn-off are to be controlled, current source means 16" uses a pair of complementary devices; a current source transistor 34a" is used for controlled turn-on and a current source transistor 34b" is used for controlled turn-off. The PNP transistor 34a" has a turn-on current-setting resistance 36a" connected between the emitter electrode thereof and a source of positive potential +V, and a biasing network comprised of resistance 38a" and temperature-compensating diode 39a", connected between the +V source and the transistor base electrode and a resistance 40a" connected between the base electrode and the control input 16-2". The NPN current source transistor for the turn-off portion of the source has its emitter electrode connected through current-source resistance 36b" to the circuit common terminal 10-2 and includes a bias network with first resistance 38b" and temperature-compensating diode 39b" connected between the base electrode of transistor 34b" and circuit common terminal 10-2, and resistance 40b" connected between the base electrode and control input 16-2". The collector electrodes of both transistors 34a" and 34b" are connected in parallel to the current source output terminal 19". The voltage follower 24" also requires a pair of complementary transistors 30a and 30b, having their emitters connected together to the voltage follower output 24"b and controlled switching device control input 12-3. The collector of the NPN follower transistor 30a is connected to a positive source +V potential while the collector of the PNP follower transistor 30b is connected to common terminal 10-2. The base electrodes of both transistors are connected together, to the non-common terminal of charging capacitor 26 and the output 19" of the current source means.

In operation, assuming that the input $V_{in}$ voltage between circuit input terminal 10-1 and circuit common terminal 10-2 has been at a substantially zero "off" value for some length of time, current source transistor 34b" is in the active condition while current source transistor 34a" is in the cut-off condition. The voltage across capacitor 26 is of substantially zero magnitude, as is the controlled switching device gate voltage $V_g$. The switching device 12a is therefore in the completely cut-off condition and load current does not flow. When the input $V_{in}$ voltage is raised to the +V ("on") level, the voltage at current source input 16-2" falls to the substantially zero level. Current source transistor 34b" is switched to the cut-off condition and current source transistor 34a" becomes active. Current flows into capacitor 26 and the voltage thereacross increases, with corresponding increase in the controlled switching device control voltage $V_g$. The voltage $V_g$ increases at the relatively rapid rate M until the switching threshold of device 12a is reached, when current begins to flow to load 11 and the conduction channel of device 12a. Responsive to load current flow, the voltage across load 11 increases, and the current diverted through feedback capacitor 18a increases, causing the current flowing from current source means output 19" to decrease. Thereupon, the charging rate of capacitor 26 is lowered such that the switching device gate voltage rate is reduced to the slower rate M'. When the switching device has substantially reached saturation, the load voltage change slows, and causes less current to be diverted through feedback capacitor 18a, whereupon the current flowing from current-source means output 19" reverts to its original value and introduces more current into capacitor 26. Responsive thereto, the controlled switching device gate voltage increases at the more rapid rate M and rapidly places the device into full saturation.

When the input $V_{in}$ voltage is switched to the substantially zero "off" voltage, the voltage at current source input 16-2" abruptly increases to about +V volts. Current source transistor 34a" is now placed in the cut-off condition, while current source transistor 34b" becomes active. Charge is now removed from capacitor 26, causing the output device gate voltage $V_g$ to fall at the relatively rapid rate M. The device begins to come out of saturation, but a substantial change in load current voltage does not occur until the saturation threshold is reached. Thereupon, the load voltage begins to decrease, which rate-of-decrease is coupled through feedback capacitance 18b to temporarily reduce the current into output terminal 19". Responsive thereto, the rate of discharge of capacitance 26 is slowed and the output device gate voltage changes at the lower rate M", causing a slower change in load current. Once the load current change is substantially complete and the output device 12a gate voltage reaches the threshold $V_{th}$ level, the amount of feedback to current source input 16-1b" is decreased and the source means output current reverts to its original value. Charge is removed from capacitance 26 at a more rapid rate, whereby the output device gate voltage falls to the original, more-rapid rate M, until output device 12a is completely turned off.

Figure 1E:
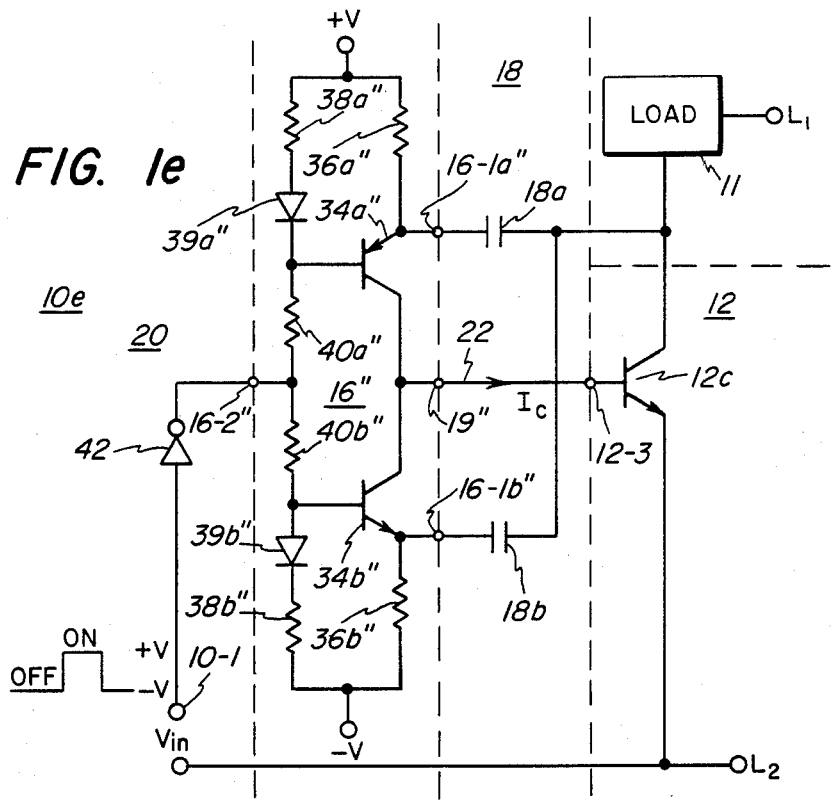
FIG. 1e is a schematic diagram of a circuit for the controlled turn-on and controlled turn-off of a current-controlled semiconductor device.

Referring now to FIG. 1e, a voltage-feedback circuit 10e for providing controlled turn-on and controlled turn-off of a current-controlled switching device (in a unipolar circuit) is illustrated. In this circuit, the controlled switching device is a bipolar transistor 12c, having a collector-source current (and therefore the current flowing through load 11) controlled by the magnitude of a current $I_c$ flowing into device control input 12c, i.e. the transistor base electrode. A current-to-voltage converter and follower means 24 is not required, whereby the current output 19" of the controlled-on/controlled-off current source means 16" is connected directly to the controlled switching device input 12-3. Circuit 10e is, in substantially all other respects, virtually identical to circuit 10d. Operation of circuit 10e is also substantially similar (if the bipolar transistor conduction and saturation threshold currents are substituted for the FET conduction and saturation threshold voltages), with the only difference being that, during turn-on, the current from source transistor 34a" is applied directly to the output transistor base electrode, while during turn-off, the output current of the turnoff transistor 34b" is extracted directly from the output device base electrode.

Figure 1F:
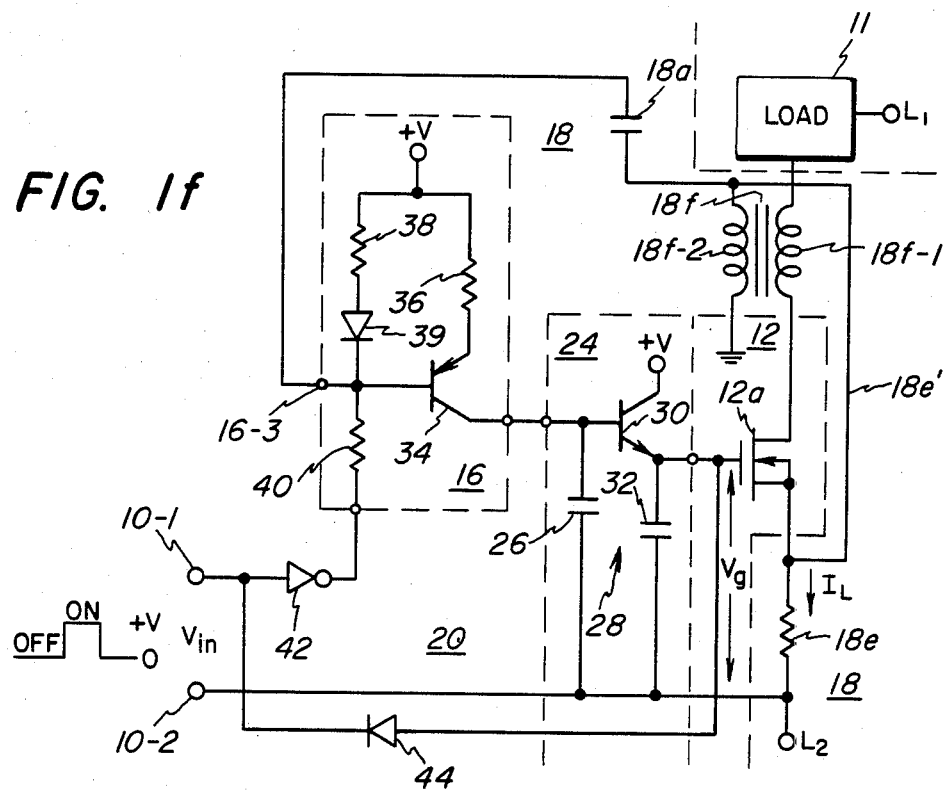
FIG. 1f is a schematic diagram of a circuit for the fast turn-off and controlled turn-on switching of a voltage-controlled semiconductor device, using dI/dt feedback.

Referring now to FIG. 1f, a current-feedback circuit 10f for providing controlled turn-on and fast turn-off of a voltage-controlled switching device (in a unipolar circuit) is illustrated. Circuit 10f is substantially similar to circuit 10a of FIG. 1a, with the exception that feedback means 18 does not utilize a capacitor for coupling load voltage (dV/dt) changes to the current source transistor emitter electrode. The load current (dI/dt) feedback is provided by use of a current sampling resistance 18e, connected between the circuit common 10-2/line $L_2$ terminal and the source electrode of the controlled switching FET device 12a. Responsive to the flow of load current $I_L$ through sensing resistance 18e, a voltage is realized across that resistance, which load-current-related voltage is fed back through capacitance 18a to input terminal 16-3, at the current source transistor base electrode. Thus, as load current $I_L$ increases, a greater voltage is realized across resistance 18e and the current source transistor 34 base potential rises, reducing the voltage across current-setting resistance 36 to provide the slower rate M' during turn-on.

Alternatively, the current-sensing resistance 18e need not be utilized, and a transformer 18f may be substituted therefor. The primary winding 18f-1 of the transformer is connected in series between load 11 and the drain-source conduction channel of the switching device 12a. The transformer secondary winding 18f-2 is connected between common potential and the isolation feedback capacitor 18a. As the load current begins to increase during controlled turn-on, the voltage drop across primary winding 18f-1 increases and this increase in voltage is coupled to secondary winding 18f-2, and to the current source input terminal 16-3, temporarily decreasing the current source output current. It should be understood that other forms of current feedback, as known to the art, can be utilized, and that the load current feedback arrangement can be utilized with a fast turn-on/controlled turn-off or a controlled turn-on/controlled turn-off switching circuit, as required for the particular end use.

Several presently preferred embodiments of my novel circuitry for controlled switching of non-regenerative power semiconductors have been illustrated, as well as several preferred uses of the controlled switching methods. Many variations and modification will now become apparent to those skilled in the art, especially in line-frequency or other low-switching-rate applications where the switching loss introduced by the somewhat slower change in load current offer a viable alternative to the losses incurred in passive snubbers and EMI filters. It is my intent, therefore, to be limited only by the scope of the appending claims and not by the specific details and instrumentalities presented by way of explanation of the illustrative examples herein.

What I claim is:

1. A method for the controlled switching, between a fully-turned-off condition and a fully-turned-on condition, of a non-regenerative power semiconductor device having a controlled current flow, with a conduction threshold and a saturation threshold, therethrough responsive to a control electrode signal, comprising the steps of:
    (a) providing a drive signal having first and second characteristics each respectively for directing the device to an associated one of the fully-turned-on and fully-turned-off conditions of the current flow therethrough;
    (b) selecting at least one direction of change between the first and second conditions of said drive signal as an associated controlled direction of change of the control electrode signal;
    (c) changing the control electrode signal at a first rate M responsive to a change of the drive signal in each selected controlled direction and until a first encountered one of the thresholds is reached;
    (d) then reducing the rate of change of the control electrode signal, in the controlled direction, to a second rate M' less than the first rate M, until the remaining one of the thresholds is reached; and
    (e) then increasing the rate of change of the control electrode signal in the controlled direction at another rate greater than the second rate M'.

2. The method of claim 1, wherein the another rate of step (e) is substantially equal to the first rate M of step (c).

3. The method of claim 1, wherein step (b) includes the step of: selecting the drive signal and controlled directions of change as that direction turning-on the device current flow.

4. The method of claim 3, further comprising the step of: substantially immediately changing the control electrode signal from a value greater than the saturation threshold to a value less than the conduction threshold when the drive signal changes in an opposite direction turning-off the device current flow.

5. The method of claim 1, wherein step (b) includes the step of: selecting the drive signal and controlled directions of change as the direction turning-off the device current flow.

6. The method of claim 5, further comprising the step of: substantially immediately changing the control electrode signal from a value less than the conduction threshold to a value greater than the saturation threshold when the drive signal changes in an opposite direction turning-on the device current flow.

7. The method of claim 5, wherein step (b) also includes the step of: also selecting the drive signal and controlled directions of change as that direction turning-on the device current flow.

8. The method of claim 1, wherein the device is electrically connected to a current-consuming load, and further comprising the step of: (f) feeding back a signal related to a parameter of the load to determine when each of the thresholds is reached.

9. The method of claim 8, wherein the load parameter is a load voltage, and wherein step (f) includes the step of: deriving the feedback signal from the time rate of change of the load voltage.

10. The method of claim 8, wherein the load parameter is a load current, and wherein step (f) includes the step of: deriving the feedback signal from the time rate of change of the load current.

11. The method of claim 8, wherein the control electrode signal is a control electrode current; step (c) further includes the step of: providing a current source for generating the control electrode current of substantially constant magnitude; and step (d) includes the step of diverting a portion of the current from the source, to reduce the control electrode current, responsive to the magnitude and duration of the signal fed back from the load.

12. The method of claim 8, wherein the control electrode signal is a control electrode voltage; step (c) further includes the steps of: providing a current source for generating a current of substantially constant magnitude; converting the control current to a control voltage; and providing the control voltage as the control electrode signal; and step (d) includes the step of: diverting a portion of the current from the source, to reduce the control electrode voltage converted therefrom, responsive to the magnitude and direction of the signal fed back from the load.

13. Apparatus for controlling switching between a fully-turned-on condition and a fully-turned-off condition of a non-regenerative power semiconductor device having a controllable current flow, with a conduction threshold and a saturation threshold, therethrough responsive to a control electrode signal, comprising:
means for receiving a drive signal having first and second characteristics each respectively for directing the device to an associated one of said fully-turned-on and fully-turned-off conditions of the current flow therethrough;
first means for providing said control electrode signal responsive to the magnitude of a signal current;
means, receiving said drive signal at said receiving means and responsive to at least one of the drive signal first and second characteristics, for providing the signal current to said first means to change the control electrode signal magnitude at a first rate M and in a direction selected responsive to an associated change in direction of said drive signal; and
means for providing a feedback signal from said device to said current-providing means to change the signal current therefrom to said first means and reduce the rate of change of the control electrode signal to a second rate M', less than the first rate M, when the value of the controlled current flow through said device is between said conduction and saturation thresholds.

14. The apparatus of claim 13, wherein the control electrode signal is a control electrode voltage, and said first means comprises: means for converting the signal current from said current-providing means to a voltage for application to said device as said control electrode signal.

15. The apparatus of claim 13, wherein said current-providing means comprises: a source of operating potential; a source device having a multiplicity N of electrodes; and network means connected to said potential source and to (N−1) of the source device electrodes and configured to cause a flow of said signal current from a remaining electrode of the source device at said first rate, responsive to a selected one of the drive signal first and second characteristics.

16. The apparatus of claim 15, wherein said feedback means is coupled to one of said (N−1) electrodes of said source device.

17. The apparatus of claim 13, wherein said current-providing means comprises: means for controlling the semiconductor device current flow to change at said first rate M, from said fully-turned-off condition to said fully-turned-on condition, responsive to receiving said drive signal first characteristic; and means for substantially immediately changing the control electrode signal to cause said power semiconductor device to switch from said fully-turned-on condition to said fully-turned-off condition responsive to the presence of said drive signal second characteristic.

18. The apparatus of claim 13, wherein said current-providing means comprises: means for controlling the semiconductor device current flow to change at said first rate M, from said fully-turned-on condition to said fully-turned-off condition, responsive to receiving said drive signal first characteristic; and means for substantially immediately changing the control electrode signal to cause said power semiconductor device to switch from said fully-turned-off condition to said fully-turned-on condition responsive to the presence of said drive signal second characteristic.

19. The apparatus of claim 13, further comprising an electrical load connected to said power semiconductor device; and wherein said feedback signal providing means provides said feedback signal responsive to the time-rate-of-change of the load voltage.

20. The apparatus of claim 19, wherein said feedback signal providing means includes a capacitive series element.

21. The apparatus of claim 20, wherein said feedback signal providing means further includes means, in series with said capacitive element, for attenuating the magnitude of the feedback signal provided to said current-providing means.

22. The apparatus of claim 13, further comprising an electrical load connected to said power semiconductor device; and said feedback signal providing means provides said feedback signal responsive to the time-rate-of-change of the current flowing through said load.

23. The apparatus of claim 22, wherein said feedback signal providing means comprises: a sampling resistance element connected in series with said load; and a series capacitive element coupled between said sampling resistance and said current-providing means for providing said feedback signal responsive to the time-rate-of-change of said load current.

24. The apparatus of claim 22, wherein said feedback signal providing means comprises: a transducer having a primary winding connected in series with said load, and a secondary winding providing said feedback signal to said current-providing means responsive to the time-rate-of-change of the load current flowing through said primary winding.

* * * * *